(12) United States Patent
Krishnan

(10) Patent No.: US 6,396,075 B1
(45) Date of Patent: May 28, 2002

(54) TRANSIENT FUSE FOR CHANGE-INDUCED DAMAGE DETECTION

(75) Inventor: Srikanth Krishnan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/314,981

(22) Filed: May 20, 1999

Related U.S. Application Data

(60) Provisional application No. 60/086,882, filed on May 27, 1998.

(51) Int. Cl.[7] .............................................. H01L 23/58
(52) U.S. Cl. ..................... 257/48; 257/208; 257/209; 340/572.7; 324/769
(58) Field of Search ..................... 257/48, 208, 209, 257/428, 431; 438/128, 129; 340/572.7; 324/769

(56) References Cited

U.S. PATENT DOCUMENTS 5,874,902 A * 2/1999 Heinrich et al. ......... 340/10.51
5,883,575 A * 3/1999 Ruby et al. ............... 340/572.5
6,016,062 A * 1/2000 Nicollian et al. ............. 324/69
6,157,066 A * 12/2000 Kobayashi ................... 257/363

FOREIGN PATENT DOCUMENTS

JP          06332011 A  * 12/1994  .................. 257/363

* cited by examiner

*Primary Examiner*—Minh Loan Tran
*Assistant Examiner*—Thomas L Dickey
(74) *Attorney, Agent, or Firm*—Jacqueline J. Garner; W. James Brady, III; Frederick J. Telecky, Jr.

(57) ABSTRACT

A transient fuse (102) and antenna (110) for detecting charge-induced plasma damage in a device (112). When the transient fuse (102) is placed between the antenna (110) and the device (112), only charge-induced damage during a metal clear portion of an etch occurs in device (112). When the transient fuse (102) is placed between ground and both the device (112) and the antenna (110), charge-induced damage occurring during an overetch portion of the etch can be detected in the device (112).

11 Claims, 5 Drawing Sheets

TRANSIENT FUSE FOR CHANGE-INDUCED DAMAGE DETECTION

CROSS REFERENCE TO RELATED APPLICATIONS

This application claims priority under 35 USC 119(e)(1) of provisional application No. 60/086,882 filed May 27, 1998.

The following related co-pending application is hereby incorporated by reference:

| Serial No. | Filing Date | Inventors |
| --- | --- | --- |
| 08/987,728 | 12/9/1997 | Krishnan |

FIELD OF THE INVENTION

This invention generally relates to detection of plasma damage during semiconductor processing.

BACKGROUND OF THE INVENTION

Process-induced damage is becoming a very serious concern for semiconductor device manufacturers. Such damage accounts for device degradations and lower yields. One type of process-induced damage can occur during ash, plasma etch and plasma enhanced deposition processes (collectively referred to as plasma charging damage), and ion implantation. Charge-induced damage is becoming particularly important due to: the scaling down of gate oxide thicknesses and channel length with succeeding technologies; increasing levels of metalization; and the advent of high density plasma sources for etching and deposition.

With respect to charge-induced damage, the charge collected in the antenna stresses the oxide of a device. More specifically, in a MOSFET structure, the charge collected on the antenna stresses the gate oxide of the MOSFET, thereby inducing stress-related degradation of the MOSFET. This stress-related degradation may include: shortening the lifetime of the device, increasing the gate leakage of the device, or shifting the threshold voltage of the device.

Advanced technology nodes now require 5 and 6 levels of metallization. This results in multiple wafer exposures to the metal etch reactors. This combined with the decrease in gate oxide thickness to 60 A and below make plasma damage a primary concern during metal etch process development. Accordingly, there is a need to better understand the mechanisms of the plasma damage and to develop an approach for minimizing this damage.

SUMMARY OF THE INVENTION

Transient fuse structures for detecting plasma damage are disclosed herein. The transient fuse structures are designed to isolate plasma damage occurring at various portion of a process step. The technical advantage of the invention is providing the ability to determine a what portion of a process step (plasma etch) charge-induced damage occurs. With this understanding, appropriate damage suppression techniques can be developed and/or employed.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The embodiments of the invention are described herein in conjunction with an inductively-coupled plasma (ICP) metal etch. It will be apparent to those of ordinary skill in the art that the benefits of the invention are applicable to detecting plasma charging damage in general including plasma damage from other types of reactors and plasma damage during etches of material other than metal (for example, polysilicon).

As gate oxide thicknesses on semiconductor devices scale below 60 A, damage from plasma metal etches (such as ICP metal etches) occurs. A better understanding the mechanisms of the plasma damage is needed in order to develop ways to suppress the damage.

Evaluation of Plasma Damage

Latent antenna is the regime wherein the antenna effect of a metal conductor is raised to that of the surrounding geometry due to microloading. This occurs around endpoint in a plasma etch, when the metal is cleared in the open areas, and remains in tight geometries (due to loading effects). This latent antenna effect in conjunction with mechanisms such as electron shading effect can cause sever damage. There could also be contributions from surface current collection from halo regions around the mask.

Figure 1:
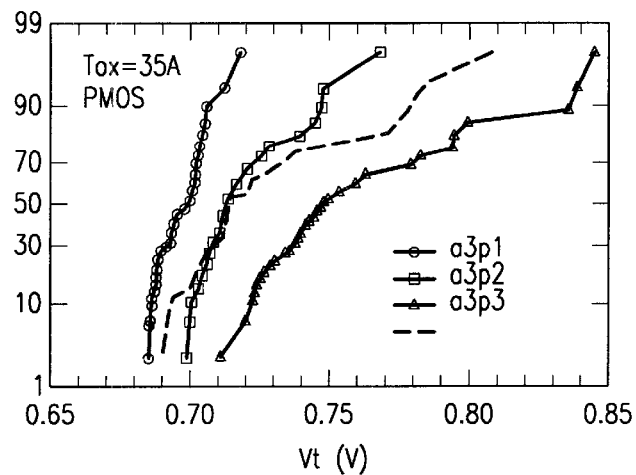
FIG. 1 is a graph of threshold voltage for various antenna perimeters.
Figure 2:
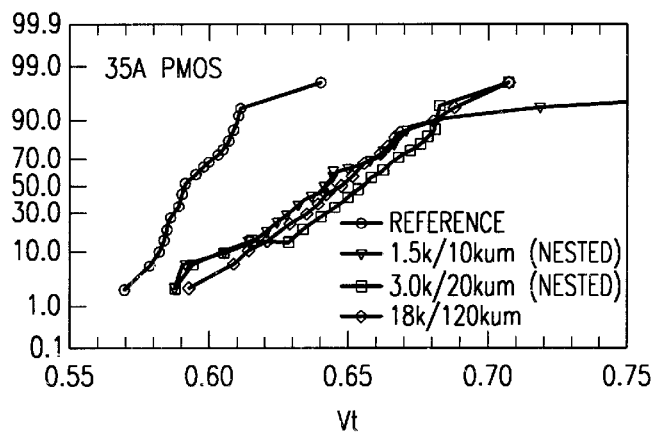
FIG. 2 is a graph of threshold voltage for various antenna nestings.

A strong antenna effect is observed for the ICP metal etch case with a monotonic increase in Vt with antenna perimeter (FIG. 1). The Vt shift is due to generation of gate-oxide charge in the pMOSFETs by the plasma current stress. Thus, the amount of plasma stress scales with the antenna perimeter. However, comparing pMOSFETs connected to a nest of metal lines to that of portions of the nest, nearly identical amounts of Vt increase can be observed (FIG. 2). The 01 kum and 20 kum nested fingers show identical Vt shifts compared to the 120 kum perimeter of the surrounding nest. This is attributed to metal clearing last in small spaces between the lines during which damage primarily occurs. The 10 kum and 20 kum antenna were raised to 120 kum antenna—clearly a hidden or latent antenna effect and an important consideration for interconnect layout.

Figures 3A, 3B, 3C:
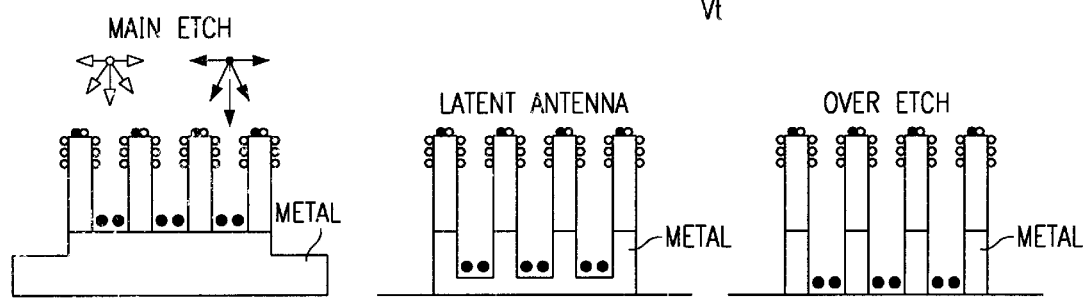
FIGS. 3A–3C are cross-sectional diagrams of an etch at various regimes: main etch, latent antenna and overetch.
Figure 4:
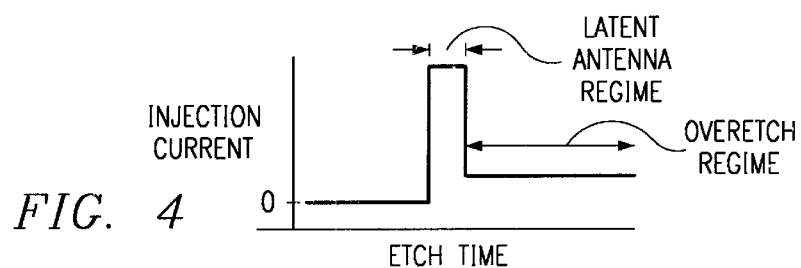
FIG. 4 is a injection current versus etch time.

The "Main Etch" regime (FIG. 3A) is the first part of the ecth during which no antenna damage occurs due to blanket covering of the metal. The "Latent Antenna" regime (FIG. 3B) is defined herein as the zone of etching around endpoint when the metal is cleared in the open areas, and remains in tight geometries (due to microloading). The "overetch" regime is the zone when the metal is cleared both in tight and wide geometries (FIG. 3C). Using simulations, it is possible to obtain a 10-fold increase in stress levels during the latent antenna regime (FIG. 4) as compared to the overetch regime.

Transient Fuse (ICP Metal Etch Process)

Figure 5A:
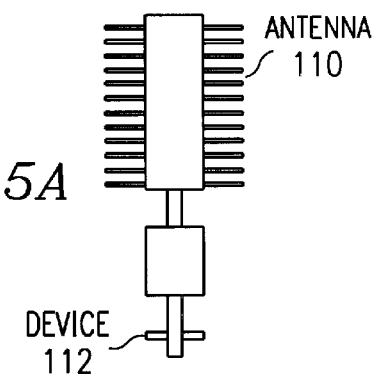
FIGS. 5A–5C are top-view diagrams of charge-induced damage detection structures according to the embodiments of the invention.
Figure 5B:
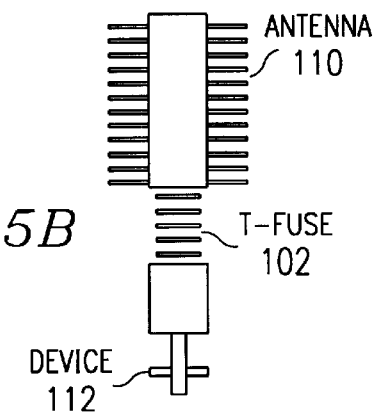

An antenna scheme has been devised that can distinguish these two regimes by using a novel fuse design—the transient fuse (T-fuse). FIG. 5A illustrates the standard antenna 110 in which the device 112 is sensitive to the full damage from both regimes. FIG. 5B illustrates a device 112 sensitive to the latent component of the antenna effect only using the T-fuse 102. This T-fuse 102 consists of closely spaced metal lines and disconnects the antenna 110 just after the latent antenna regime. The conductivity across the T-fuse 102 is maintained during the metal clearing stages. In a complementary scheme (FIG. 5C), the T-fuse 102 can activate the antenna 110 just after the latent antenna regime, making the device 112 sensitive only to the overetch regime. Using this strategy, it can be determined whether the damage occurs 1) exclusively during metal clear (latent antenna regime), 2) exclusively during overetch, and 3) during both latent antenna and overetch regimes. Process modifications can have significant impact on the damage in these two regimes. The transient fuse thus quantifies the extent of damage in the two regimes, indicating the need for process modification in the appropriate regime.

The first embodiment of the invention shown in FIG. 5B will now be discussed in further detail. Charging may be detected using a testchip incorporating an antenna structure 110 connected to device 112 using a transient fuse 102 according to a first embodiment of the invention. Transient fuse 102 is designed to provide a connection between antenna structure 110 and device 112 during the metal clear portion of the etch. This portion of the etch is sometimes referred to as the "latent antenna" regime. However, during the overetch portion transient fuse 102 is delinked, breaking the connection between the antenna structure 110 and device 112.

The antenna charging effect of closely spaced metal interconnect lines stresses the oxide of a MOS device resulting in plasma etch damage. Thus, the test structure antenna 110 is meant to roughly simulate the antenna effect in an actual device. The actual shape of antenna 110 may vary from that shown. The antenna 110 is connected during the metal clear portion of the etch and thus, the damage occurring in device 112 is that damage that occurs during the metal clear portion of the etch as opposed to damage from the overetch portion.

Figure 6:
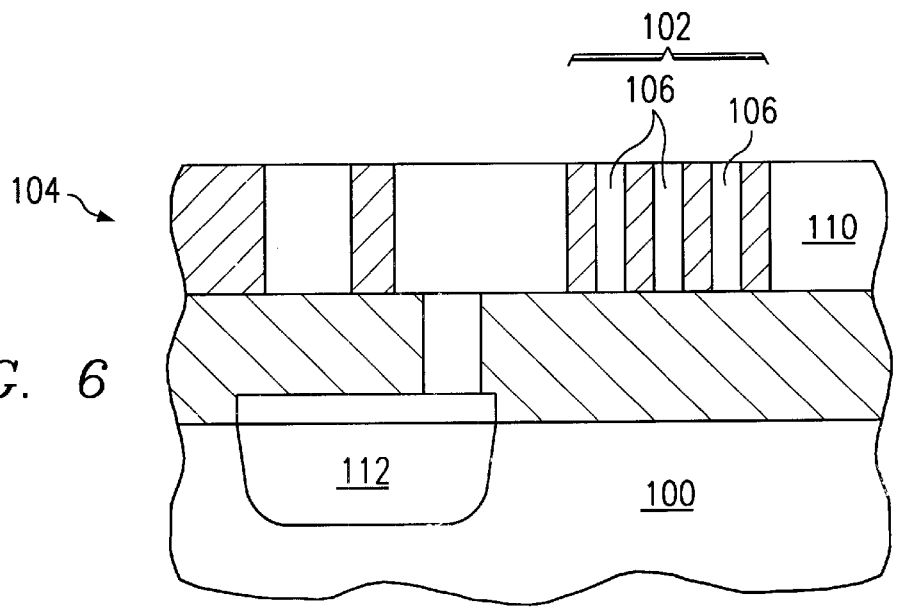
FIG. 6 is a cross-sectional view of the structure of FIG. 5B.

Transient fuse 102 is located on a semiconductor body 100. as shown in FIG. 6. Semiconductor body 100 contains devices 112 as well as other devices, and circuits (not shown) and at least one, but probably more metal interconnect layers 104. Transient fuse 102 and antenna 110 are formed as part of one of the interconnect layers 104. Similar transient fuses 102/antenna 110 combinations may be formed within the same interconnect layer or in one or more or the remaining interconnect layers as well. However, each transient fuse 102/antenna 110 combination is connected to a separate device 112. Device 112 comprises, for example, a MOS transistor. Alternatively, device 112 may comprise a MOS capacitor.

Transient fuse 102 comprises at least two closely spaced metal lines or plates. The metal lines may have a pitch on the order of the design rule used to layout the device. For example, if the design rule for a particular technology required at least 0.25 $\mu$m spacing between metal lines of interconnect layer 104, the spacing between metal lines 106 of transient fuse 102 could be on the order of 0.25 $\mu$m (for example, 0.20–0.30 $\mu$m). Preferably, the pitch of transient fuse 102 is smaller than or equal to the spacing between metal lines of interconnect layer 104.

Figure 7A:
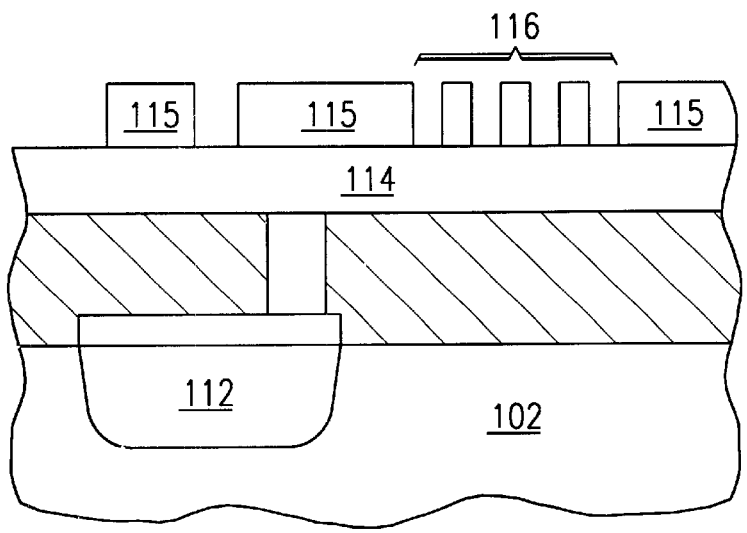
FIGS. 7A–7C are cross-sectional view of the structure of FIG. 6 at various stages of fabrication.
Figure 8:
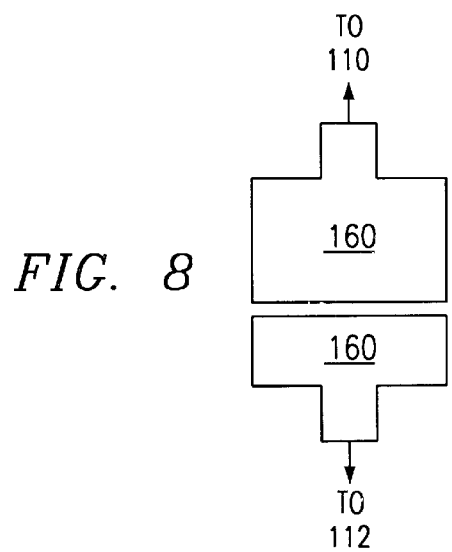
FIG. 8 is a top view of a transient fuse according to the invention using plates instead of lines.

The fabrication and operation of transient fuse 102 will now be discussed. Semiconductor body 100 is processed through the formation of device 112, interlevel dielectric 113, and the deposition of a layer of metal 114, as shown in FIG. 7A. Methods for the formation of devices such as device 112 and interlevel dielectric 113 are well known in the art. Metal layer 114 may be part of the first or any subsequent metal interconnect layer. Metal layer 114 is patterned using mask 115, to form the desired interconnect layer. Mask 115 conventionally consists of at least one set of lines separated so as to form the minimum design rule spacing between the subsequently formed metal lines from metal layer 114. In addition to conventional structures, mask 115 also comprises a transient fuse portion 116. Transient fuse portion 116 comprises at least one or two (three are shown) lines separated so as to form a space or spaces between subsequently formed metal lines. The space could also be achieved by placing one or more plates 160 in proximity to the subsequently formed metal lines as shown in FIG. 8. In the case of multiple plates 160, it is the space between plates 160 that is critical.

Figure 7B:
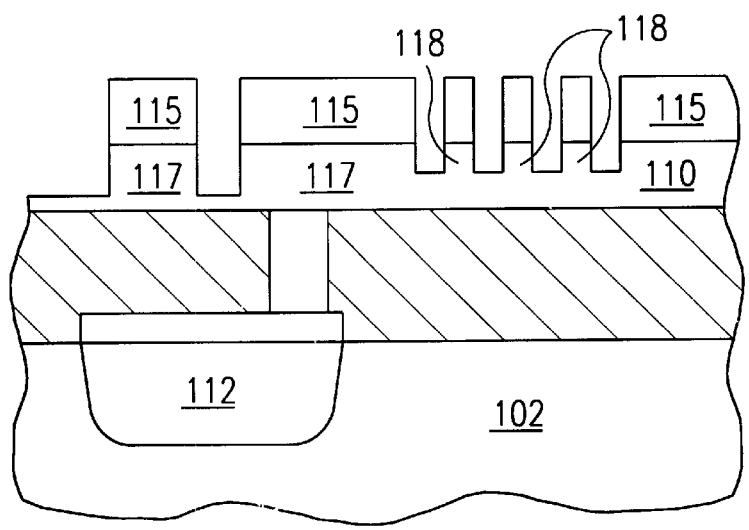
Figure 7C:
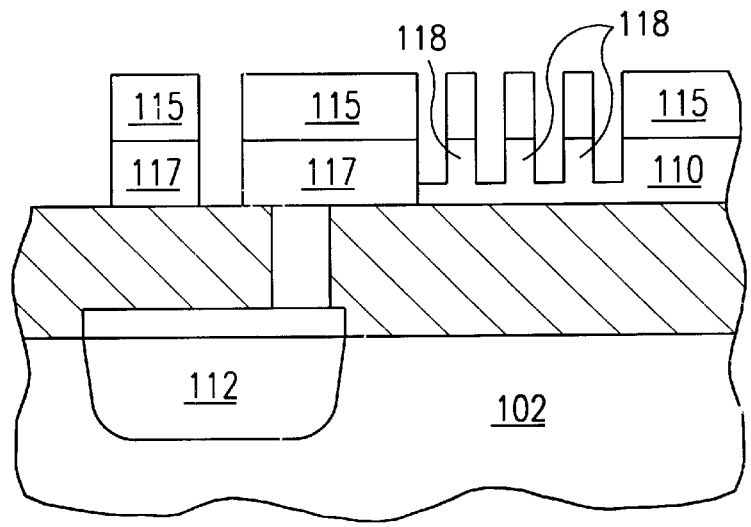

The structure is then subjected to an ICP metal etch as shown in FIG. 7B. As shown in FIG. 7B, the metal between minimum design rule spacing lines 118 contains some metal material after the metal between further spaced lines 117 has disappeared. Thus, there is a connection between the device 112 and antenna 110 through the transient fuse 102. Whether the metal between lines 117 clears before, during, or after the metal within transient fuse 102 depends on whether the spacing between metal lines 117 is larger, equal to, or smaller than, respectively, the spacing within transient fuse 102. FIG. 7B, shows the spacing between metals lines 117 as larger than the spacing within transient fuse 102. Because, metal in tight spaces clears last, the metal between lines 117 will clear before the metal within transient fuse 102 in this case as shown in FIG. 7C. As etching continues and the metal material between the lines of transient fuse 102 is removed, the connection to antenna 110 is severed.

Figure 9A:
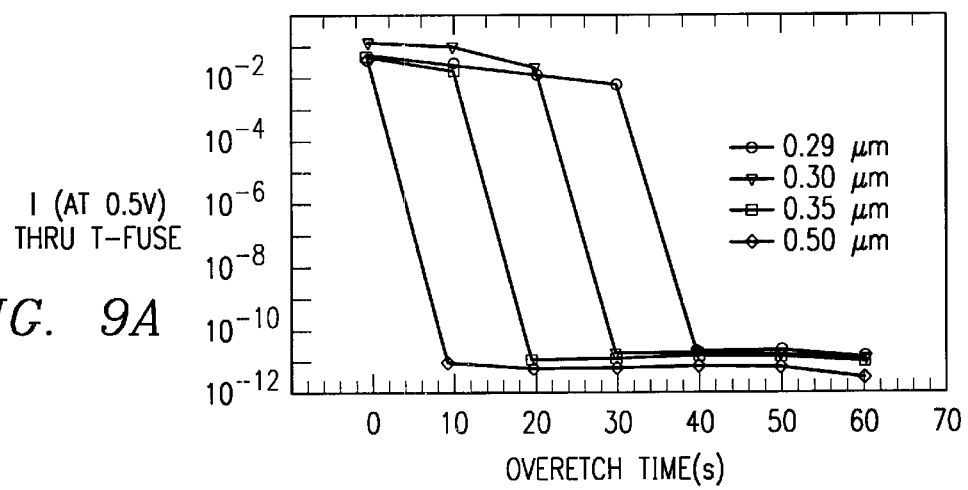
FIG. 9A is a graph of current through the T-fuse for various T-fuse pitch.
Figure 9B:
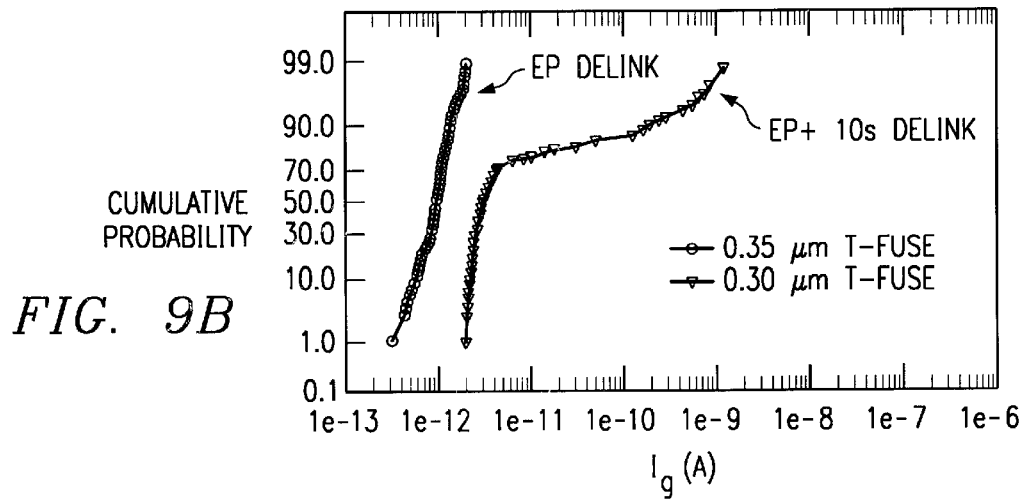
FIG. 9B is a graph of leakage current for various T-fuse pitches.

If desired, the spacing between the lines of transient fuse 102 can be decreased. Decreasing the spacing causes the metal between the lines to not be cleared until further into the overetch portion of the etch (FIGS. 9A–9B). In this way, the plasma damage from the overetch portion can be dissected and further evaluated. If desired, several transient fuses 102 can be used, each with varying space between lines to further divide the plasma damage. Referring to FIGS. 9A–9B, there is window (approx. 40 s) over which the T-fuse will "auto-disconnect" progressively, thus profiling the overetch regime. For example, the antenna P6 when using a 0.3 μm T-Fuse remains connected for 10 s longer than the 0.35 μm T-fuse. In this case most of the charging occurs in this 10 s regime following endpoint (FIG. 9B). Thus, the T-fuse with varying metal pitch can be used to profile the charging within the overetch regime.

Figure 5C:
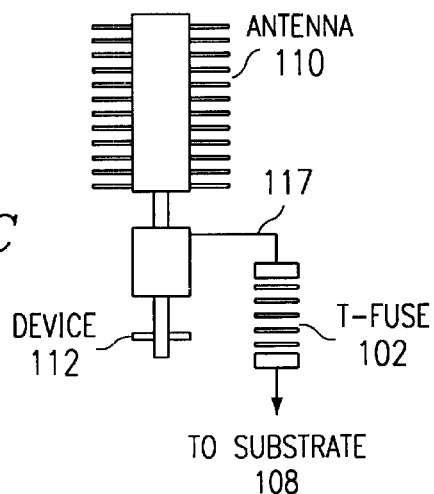

A test structure according to a second embodiment of the invention is shown in FIG. 5C. Here, device 112 is connected through metal line 117 to antenna 110. Transient fuse 102 is connected between metal line 117 and substrate/ground 108. Device 112, antenna 110 and transient fuse 102 are the same structures as described in the first embodiment connected in a different way. Any antenna effect caused by antenna 110 is grounded out through transient fuse during the metal clear portion of the etch. However, once the spaces between metal lines 118 clears (i.e., during the overetch portion) the connection to ground is severed. Any plasma damage occurring to device 112 is thus caused during the overetch portion of the etch.

In some processes, such as the one described below, the majority of the damage occurs during the metal clear portion of the etch, whereas in other processes, the majority of the damage can occur during the overetch portion. The above two embodiments work best when combined so that the plasma damage during the respective portions of the etch can be isolated and compared. Then, damage suppression techniques, such as process variations or damage suppression structures, can be developed to minimize the plasma damage for a particular process. Such plasma damage suppression structures are described in co-pending, co-assigned U.S. patent application Ser. No. 08/987,728, filed Dec. 9, 1997, now issued as U.S. Pat. No. 5,998,299 on Dec. 7, 1999, entitled "Protection Structures for the Suppression of Plasma Damage" and assigned to Texas Instruments Incorporated.

Experimental Results

Charging is detected using novel antenna structures connected to CMOS devices using a 0.18 μm process flow with 36 Å gate oxide. Devices were electrically tested in-line following polysilicon gate etch as well as metal etch. Polysilicon gate etch was performed on a low density Magnetically Enhanced Reactive Ion Etch (MERIE) reactor with a Cl$_2$/HBr chemistry and high magnetic field (100 Gauss). Metal etch was performed in commercial Inductively Coupled Plasma (ICP) reactors using a BCl$_3$/Cl$_2$ chemistry.

Figure 10:
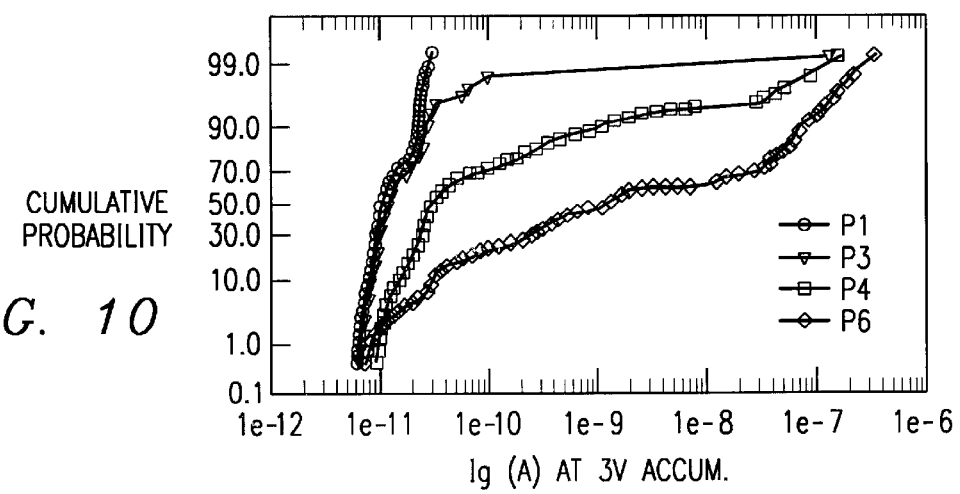
FIG. 10 is a graph of leakage current for various antenna perimeter.
Figure 11:
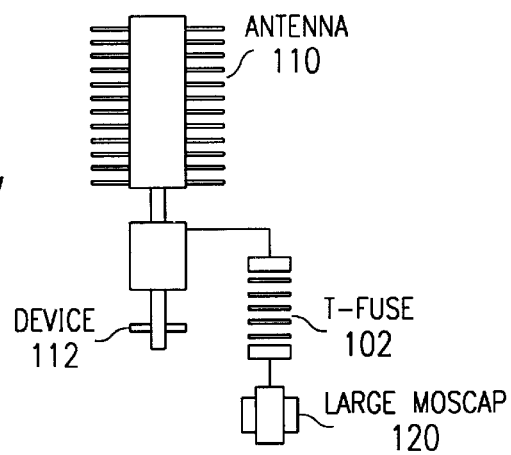
FIG. 11 is a top view of another embodiment of the invention using a large MOSCAP as the antenna supression structure.
Figure 12:
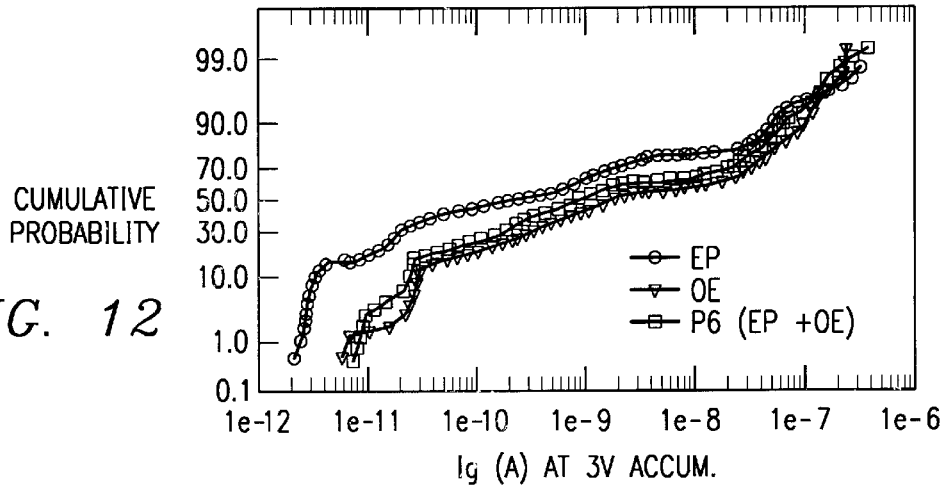
FIG. 12 is a graph of gate leakage for a polysilicon etch illustrating the damage from the latent regime, the overetch regime and the combination of the two regimes.

Polysilicon etch damage from a high magnetic field (100 G) MERIE process is shown in FIG. 10 for 36 Å MOSFETs. The extent of plasma damage is indicated by the monotonic increase in gate leakage with antenna perimeter. The application of transient fuse concept to detect latent antenna damage during polysilicon gate etch is similar to the Metal etch case. The polysilicon antenna is connected to the device through a polysilicon transient fuse. However for the complementary implementation, i.e. overetch damage detection, contacts to substrate for one end of the transient fuse are unavailable at this stage of processing. Therefore, a modified scheme (FIG. 11) employing a large capacitor 120 in lieu of the substrate connection to lower the antenna ratio during the latent antenna phase is used. Thus, the antenna ratio is suppressed by the transient fuse during the latent antenna regime, and is raised during the overetch regime for this case. Other antenna suppression structures such as a MOSFET or diode may alternatively be used. In this experiment, antenna ratio during the latent antenna regime is suppressed to 24 from that of 60,000 during the overetch. Results using this method for a High magnetic field (100 Gauss) MERIE polysilicon etch are shown in FIG. 12. For a damage mechanism that involves B-field, polysilicon clearing damage is similar to that of the overetch damage. Hence process optimization has to be addressed for both these regimes.

While this invention has been described with reference to illustrative embodiments, this description is not intended to be construed in a limiting sense. Various modifications and combinations of the illustrative embodiments, as well as other embodiments of the invention, such as using interdigitated lines for the T-fuse, will be apparent to persons skilled in the art upon reference to the description. It is therefore intended that the appended claims encompass any such modifications or embodiments.

What is claimed is:

1. A test structure, comprising:

a first device; and a conductive layer comprising a first antenna and a first transient fuse connected to both said first antenna and said first device, wherein said first transient fuse comprises a plurality of closely spaced conductive structures.

2. The structure of claim 1, wherein said closely spaced conductive structures are lines.

3. The structure of claim 1, wherein said closely spaced conductive structures are plates.

4. The structure of claim 1, wherein said first transient fuse is connected between said first device and said first antenna.

5. The structure of claim 1, wherein said first transient fuse is connected between an antenna suppression structure and both the first device and the first antenna.

6. The structure of claim 5, wherein said antenna suppression structure comprises a grounded substrate.

7. The structure of claim 5, wherein said antenna suppression structure comprises a MOS capacitor.

8. The structure of claim 5, wherein said antenna suppression structure comprises a MOSFET.

9. The structure of claim 5, wherein said antenna suppression structure comprises a diode.

10. The structure of claim 1 wherein said first transient fuse is connected between said first device and the first antenna and further comprising:

a second device;

a second antenna; and a second transient fuse connected between an antenna suppression structure and both the second device and the second antenna.

11. The structure of claim 10, wherein said antenna suppression structure comprises a grounded substrate.

* * * * *